US012765075B2

(12) United States Patent
Akhavan-Tafti

(10) Patent No.: US 12,765,075 B2
(45) Date of Patent: *Oct. 13, 2026

(54) ELECTROMAGNETIC ENERGY CONVERTER

(71) Applicant: THE REGENTS OF THE UNIVERSITY OF MICHIGAN, Ann Arbor, MI (US)

(72) Inventor: Mojtaba Akhavan-Tafti, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/644,833

(22) PCT Filed: Sep. 7, 2018

(86) PCT No.: PCT/US2018/049880

§ 371 (c)(1),
(2) Date: Mar. 5, 2020

(87) PCT Pub. No.: WO2019/051178

PCT Pub. Date: Mar. 14, 2019

(65) Prior Publication Data

US 2021/0075361 A1 Mar. 11, 2021

Related U.S. Application Data

(60) Provisional application No. 62/555,686, filed on Sep. 8, 2017.

(51) Int. Cl.
*H10F 19/80* (2025.01)
*B64U 50/35* (2023.01)
(Continued)

(52) U.S. Cl.
CPC ............. *H10F 19/80* (2025.01); *B64U 50/35* (2023.01); *H02S 20/30* (2014.12); *H02S 40/22* (2014.12);
(Continued)

(58) Field of Classification Search
CPC ............... H01L 31/048; H01L 31/0543; H01L 31/0547; H01L 31/0216; H01L 31/0504;
(Continued)

(56) References Cited

U.S. PATENT DOCUMENTS 4,106,952 A 8/1978 Kravitz
4,224,082 A 9/1980 Jacobson
(Continued)

FOREIGN PATENT DOCUMENTS

BR 9000510 A 1/1991
CN 103384920 A 11/2013
(Continued)

OTHER PUBLICATIONS

"3M Ultra Barrier Solar Film 510-F." 3M™ Ultra Barrier Solar Film 510-F, 3M, Oct. 2016, https://multimedia.3m.com/mws/media/1285470O/3m-ultra-barrier-solar-film-510-f.pdf. (Year: 2016).*
(Continued)

*Primary Examiner* — Kourtney R S Carlson
(74) *Attorney, Agent, or Firm* — Reising Ethington P.C.

(57) ABSTRACT

An enclosed multi-dimensional system for converting electromagnetic (EM) energy into electricity. An enclosed EM energy converter is comprised of a housing, electric-current-producing cells, and media from a list of luminescent, transmissive, absorptive, diffusive, refractive, dispersive, conductive, and dielectric materials or a combination thereof wherein the photovoltaic cells are not directly facing the incoming EM energy. This feature enables the production of compact and easy-to-manufacture EM convertors. Multiple
(Continued)

EM converters can be coupled in series or in parallel to maximize efficiency. EM energy sources can be used to deliver both energy and information. Active optics, adaptive optics, and optoelectronics can operably be coupled with the EM converter. The portability, scalability, and connectivity of the system make it particularly attractive for long-distance energy conversion applications may it be underground, air-based, or spaceborne.

27 Claims, 8 Drawing Sheets

(51) Int. Cl.

| | |
|---|---|
| ***H02S 20/30*** | (2014.01) |
| ***H02S 40/22*** | (2014.01) |
| ***H02S 40/42*** | (2014.01) |
| ***H10F 19/90*** | (2025.01) |
| ***H10F 77/30*** | (2025.01) |
| ***H10F 77/42*** | (2025.01) |
| ***H10F 77/45*** | (2025.01) |

(52) U.S. Cl.
CPC ........... *H02S 40/42* (2014.12); *H10F 19/902* (2025.01); *H10F 77/30* (2025.01); *H10F 77/45* (2025.01); *H10F 77/484* (2025.01)

(58) Field of Classification Search
CPC ....... H01L 31/055; H02S 10/40; H02S 20/30; H02S 40/42; H02S 40/22; H02S 40/425; H10F 19/80; H10F 77/30; H10F 77/45
USPC .......................................................... 136/247
See application file for complete search history.

(56) References Cited

U.S. PATENT DOCUMENTS

| | | | | |
|---|---|---|---|---|
| 4,331,829 | A * | 5/1982 | Palazzetti | H01L 31/02168 136/253 |
| 4,338,480 | A | 7/1982 | Antypas et al. | |
| 4,441,143 | A | 4/1984 | Richardson, Jr. | |
| 4,746,370 | A | 5/1988 | Woolf | |
| 5,009,243 | A | 4/1991 | Barker | |
| 5,068,865 | A | 11/1991 | Ohshima et al. | |
| 5,110,368 | A | 5/1992 | Otto et al. | |
| 6,060,658 | A | 5/2000 | Yoshida et al. | |
| 6,087,579 | A | 7/2000 | Muskatevc | |
| 6,223,675 | B1 | 5/2001 | Watt et al. | |
| 7,797,939 | B2 | 9/2010 | Green | |
| 8,146,527 | B2 | 4/2012 | Pellen | |
| 8,553,742 | B1 | 10/2013 | Wu | |
| 8,664,514 | B2 | 3/2014 | Watters | |
| 8,787,420 | B2 | 7/2014 | Kimoto et al. | |
| 8,860,165 | B2 | 10/2014 | Okaniwa et al. | |
| 8,963,704 | B2 | 2/2015 | Adami | |
| 9,048,609 | B2 | 6/2015 | Kim | |
| 9,059,558 | B2 | 6/2015 | Zhu et al. | |
| 9,158,178 | B2 | 10/2015 | Smeeton et al. | |
| 9,172,207 | B2 | 10/2015 | Chen | |
| 9,180,551 | B2 | 11/2015 | Paganelli | |
| 9,203,212 | B2 | 12/2015 | Kurobe et al. | |
| 9,592,742 | B1 | 3/2017 | Sosinov et al. | |
| 10,027,412 | B2 | 7/2018 | Eroglu et al. | |
| 11,145,046 | B2 | 10/2021 | Lakshmanan et al. | |
| 11,245,469 | B2 | 2/2022 | Lakshmanan et al. | |
| 2004/0149988 | A1 | 8/2004 | Shiozaki et al. | |
| 2006/0266407 | A1 | 11/2006 | Lichy et al. | |
| 2007/0012353 | A1 | 1/2007 | Fischer et al. | |
| 2008/0000518 | A1* | 1/2008 | Basol | H01L 31/048 136/247 |
| 2008/0245401 | A1 | 10/2008 | Winston et al. | |
| 2008/0289682 | A1 | 11/2008 | Adriani et al. | |
| 2009/0009847 | A1 | 1/2009 | Sasagawa et al. | |
| 2009/0040750 | A1 | 2/2009 | Myer | |
| 2009/0272424 | A1 | 11/2009 | Ortabasi | |
| 2009/0272425 | A1 | 11/2009 | Green | |
| 2010/0089436 | A1* | 4/2010 | Watters | H01L 31/0547 136/246 |
| 2010/0212717 | A1 | 8/2010 | Whitlock et al. | |
| 2010/0236609 | A1 | 9/2010 | Tweedie | |
| 2011/0017256 | A1 | 1/2011 | Stevens | |
| 2011/0056534 | A1 | 3/2011 | Ding et al. | |
| 2011/0061717 | A1* | 3/2011 | Kwon | G02B 3/0056 136/246 |
| 2011/0232211 | A1* | 9/2011 | Farahi | G02B 6/4295 52/173.3 |
| 2011/0247677 | A1* | 10/2011 | Forsyth | H10F 77/488 136/246 |
| 2011/0253197 | A1* | 10/2011 | Mapel | H10F 77/45 359/884 |
| 2011/0278440 | A1 | 11/2011 | Chan et al. | |
| 2011/0290296 | A1 | 12/2011 | Daniel et al. | |
| 2011/0305010 | A1 | 12/2011 | Leadford et al. | |
| 2012/0031018 | A1 | 2/2012 | Kapany | |
| 2012/0080078 | A1* | 4/2012 | Farrelly | H01L 31/049 438/66 |
| 2012/0118359 | A1 | 5/2012 | Battistutti | |
| 2012/0240982 | A1* | 9/2012 | Corneille | H01L 31/0481 136/251 |
| 2013/0038919 | A1 | 2/2013 | Gibson et al. | |
| 2013/0112239 | A1 | 5/2013 | Liptac et al. | |
| 2013/0174896 | A1 | 7/2013 | Ardo et al. | |
| 2013/0192656 | A1* | 8/2013 | Hardin | H01L 31/02363 438/94 |
| 2013/0192662 | A1 | 8/2013 | Snidow | |
| 2013/0200709 | A1 | 8/2013 | Kirchner et al. | |
| 2013/0340808 | A1* | 12/2013 | Komatsu | H10F 77/45 136/247 |
| 2013/0346166 | A1 | 12/2013 | Chihara | |
| 2014/0130851 | A1* | 5/2014 | Osamura | B32B 25/18 136/251 |
| 2015/0034147 | A1* | 2/2015 | Le Perchec | H01L 31/02322 136/251 |
| 2015/0101761 | A1 | 4/2015 | Moslehi et al. | |
| 2015/0144191 | A1* | 5/2015 | Declerck | B32B 17/10018 136/257 |
| 2015/0336669 | A1 | 11/2015 | Kantor et al. | |
| 2016/0049799 | A1 | 2/2016 | Takatsu et al. | |
| 2016/0254781 | A1 | 9/2016 | Pisharodi | |
| 2017/0077867 | A1* | 3/2017 | Hohulin | H02S 99/00 |
| 2017/0170776 | A1 | 6/2017 | Janowski | |
| 2017/0174092 | A1 | 6/2017 | Kohnke | |
| 2018/0076758 | A1 | 3/2018 | Miranda | |
| 2019/0131921 | A1* | 5/2019 | Bae | G02B 19/0042 |
| 2019/0252565 | A1 | 8/2019 | Lyons | |
| 2019/0323733 | A1 | 10/2019 | Lv | |
| 2020/0177026 | A1 | 6/2020 | Sosinov et al. | |
| 2022/0060142 | A1 | 2/2022 | Akhavan-Tafti | |
| 2022/0379762 | A1 | 12/2022 | Akhavan-Tafti | |

FOREIGN PATENT DOCUMENTS

| | | | | |
|---|---|---|---|---|
| CN | 207701042 | U | 8/2018 | |
| GB | 2479024 | A | 9/2011 | |
| JP | 3220934 | B2 | 10/2001 | |
| JP | 2003346521 | A | 12/2003 | |
| JP | 2017127040 | A | 7/2017 | |
| JP | 6376732 | B2 | 8/2018 | |
| KR | 10-2010-0027379 | A | 3/2010 | |
| KR | 100973774 | B1 | 8/2010 | |
| KR | 20120013745 | A | 2/2012 | |
| KR | 20140028179 | A | 3/2014 | |
| KR | 20160015716 | A | 2/2016 | |
| KR | 20160043902 | A | 4/2016 | |
| KR | 20160071486 | A * | 6/2016 | H02S 10/00 |
| KR | 20160133838 | A | 11/2016 | |
| KR | 20160142014 | A | 12/2016 | |
| KR | 20170024300 | A | 3/2017 | |
| KR | 20190118689 | A | 10/2019 | |
| WO | 2012/173350 | A2 | 12/2012 | |
| WO | WO-2012/166048 | A1 | 12/2012 | |

(56) References Cited

FOREIGN PATENT DOCUMENTS

| | | | | |
|---|---|---|---|---|
| WO | 2015-009482 | A2 | 1/2015 | |
| WO | WO-2015173924 | A1 * | 11/2015 | ............ H02S 40/22 |
| WO | 2015196296 | A1 | 12/2015 | |
| WO | 2016187328 | A1 | 11/2016 | |
| WO | 2017-097772 | A1 | 6/2017 | |

OTHER PUBLICATIONS

Liu, Ji-Tao, et al. "Curing Determination of EVA for Solar Panel Application by DSC." Curing Determination of EVA for Solar Panel Application, PerkinElmer, Inc, 2010, https://www.s4science.at/wordpress/wp-content/uploads/2018/10/EVA-Curing-for-Solar-Panels_DSC8000_APP.pdf. (Year: 2010).*

International Search Report and Written Opinion of the International Searching Authority issued in PCT/US2018/049880, mailed Nov. 21, 2018; ISA/US.

International Search Report and Written Opinion of the International Searching Authority regarding International Patent Application No. PCT/US2022/016614, dated May 31, 2022.

International Search Report regarding International Application No. PCT/US2021/047268 Dated Dec. 21, 2021.

International Search Report and Written Opinion mailed Apr. 29, 2020 regarding PCT/US2019/026580.

Tomoyoshi Motohiro et al, "Concept of the solar-pumped laser-photovoltaics combined system and its application to laser beam power feeding to electric vehicles", Japanese Journal of Applied Physics, 2017.

International Search Report and Written Opinion of the International Searching Authority issued in PCT/US2020/059262, mailed Feb. 26, 2021, ISA/US.

D.-R. Kim, S.-H. Yang, H.-S. Kim, Y.-H. Son, and S.-K. Han, "Outdoor Visible Light Communication for inter-vehicle communication using Controller Area Network," in 2012 Fourth International Conference on Communications and Electronics (ICCE), Hue, Vietnam, Aug. 2012, pp. 31-34. doi: 10.1109/CCE.2012.6315865.

Wang, Yiguang, Xingxing Huang, Jianyang Shi, Yuan-quan Wang, and Nan Chi. "Long-Range High-Speed Visible Light Communication System over 100-m Outdoor Transmission Utilizing Receiver Diversity Technology." Optical Engineering 55, No. 5 (May 2016): 056104.

Kim, Yong Hyeon, Willy Anugrah Cahyadi, and Yeon Ho Chung. "Experimental Demonstration of VLC-Based Vehicle-to-Vehicle Communications Under Fog Conditions." IEEE Photonics Journal 7, No. 6 (Dec. 2015): 1-9.

Rodríguez, Juan, Diego G. Lamar, Daniel G. Aller, Pablo F. Miaja, and Javier Sebastián. "Efficient Visible Light Communication Transmitters Based on Switching-Mode Dc-Dc Converters." Sensors 18, No. 4 (Apr. 2018): 1127.

Vega-Colado, César, Belén Arredondo, Juan Carlos Torres, Eduardo López-Fraguas, Ricardo Vergaz, Diego Martín-Martín, Gonzalo Del Pozo, et al. "An All-Organic Flexible Visible Light Communication System." Sensors 18, No. 9 (Sep. 2018): 3045.

Gordon Povey, "An IEEE Standard For Visible Light Communications", Visible Light Communications, Apr. 7, 2011.

"Shedding Light on LiFi", Pure LiFi, Aug. 2017.

"Deok Rae Kim et al., ""Outdoor Visible Light Communication For Inter-Vehicle Communication Using Control Area Network"", ICCE, 2012 (pp. 31-34)."

Harald Haas, "LiFi is a Paradigm-Shifting 5G Technology", Reviews in Physics, Oct. 27, 2017.

Mohamed Sufyan Islim et al., "The Impact of Solar Irradiance on Visible Light Communications", Journal of Lightwave Technology, vol. 36, No. 12, Jun. 15, 2018.

Saeed Ur Rehman et al., "Visible Light Communication: A System Perspective—Overview and Challenges", Sensors, Mar. 7, 2019.

Bugra Turan et al., "Vehicular Visible Light Communications", Intech, 2017.

Alin-Mihai Cailean et al., "A Survey on the Usage of DSRC and VLC in Communication-Based Vehicle Safety Applications", IEEE, 2014.

Cen Liu, "Enabling Vehicular Visible Light Communication (V2LC) Networks", VANET '11, Sep. 23, 2011.

Arnez Pramesti Ardi et al., "VLC-Based Car-to-Car Communication", Jurnal Elecktronika dan Telekomunikasi (JET), vol. 20, No. 1, Aug. 2020, pp. 16-22.

Trong-Hop Do et al., "Potentialities and Challenges of VLC Based Outdoor Positioning", IEEE, 2015.

Hossien B. Eldeeb et al., "Vehicle-to-Vehicle Light Communication: How to Select Receiver Locations for Optimal Performance", IEEE.

Mohammed Elamassie et al., "Effect of Fog and Rain on the Performance of Vehicular Visible Light Communications", IEEE, 2018.

Hossien B. Eldeeb et al., "MAC Layer Performance of Multi-Hop Vehicular VLC Networks with CSMA/CA", 12th International Symposium on Communication Systems, Networks and Digital Signal Processing, 2020.

Harald Haas et al., "What is LiFi?", Journal of Lightwave Technology, IEEE, 2015.

Harald Haas et al., "Introduction to Indoor Networking Concepts and Challenges in LiFi", Journal of Optical Communications and Networking, vol. 12, No. 2, Feb. 2020.

Pable Palacios Jativa et al., "Performance Analysis of OFDM-Based VLC Schemes in NLOS Channels", IEEE, Downloaded May 16, 2021.

S. Sivaguru,"A High Speen Open Access Visible Light Communication System Based on Intensity Modulation", International Journal of Science Technology & Engineering, vol. 3, Issue 08, Feb. 2017.

Rahul R. Sharma et al., "Implementation of a Simple Li-Fi Based System", International Journal of Computing and Technology, vol. 1, Issue 9, Oct. 2014.

Tahmid H. Talukdar et al., "Small Scale Wireless Data Transmission via Light Using Light Source", Proceedings of the International Conference on Engineering Research, Innovation, and Education 2017.

Soumyajit Chatterjee, "Point-to-Point Digital Communication using VLC (Visible Light Communication) and LiFi Technology", IEEE.

Extended European Search Report regarding Patent Application No. 20884793.9, dated Oct. 16, 2023.

Chinese Office Action regarding Patent Application No. 201880072200.4, dated Sep. 21, 2023.

Chinese Office Action regarding Patent Application No. 2018800722004, dated Mar. 7, 2023.

International Search Report and Written Opinion of the ISA issued in PCT/US2023/029454, mailed Nov. 21, 2023; ISA/US.

Chinese Office Action regarding Patent Application No. 201880072200.4, dated Feb. 22, 2024.

Extended European Search Report regarding EP Application No. 21862535 dated Jul. 26, 2024.

German Office Action regarding Patent Application No. 112018004929.9, dated Sep. 19, 2024.

Chinese Office Action regarding Patent Application No. 201880072200.4, dated Jul. 1, 2024.

Chinese Office Action regarding Chinese Application No. 2018800722004, dated Sep. 19, 2024.

* cited by examiner

ELECTROMAGNETIC ENERGY CONVERTER

CROSS-REFERENCE TO RELATED APPLICATIONS

This application is the U.S. National Phase Application under 35 U.S.C. 371 of International Application No. PCT/US2018/049880 filed Sep. 7, 2018, which claims the benefit of U.S. Provisional Application No. 62/555,686, filed Sep. 8, 2017. The entire disclosures of the above applications are incorporated herein by reference.

FIELD

The present disclosure relates to a device and method to improve energy storage systems required to power mobile or stationary devices.

BACKGROUND AND SUMMARY

This section provides background information related to the present disclosure which is not necessarily prior art. This section also provides a general summary of the disclosure, and is not a comprehensive disclosure of its full scope or all of its features.

Photovoltaic solar panels are commonly used for conversion of light energy into electricity for mobile objects may it be ground-based or air/space-based. Electromagnetic (EM) energy is widely used for powering and propelling satellites (i.e. solar sail).

With electronic circuits shrinking, energy delivery and storage are becoming more challenging. Laser communication/power delivery has been proposed as a way to create more compact and, in the case of the present teachings, 3D structures. Current solutions include monochromatic laser-illuminated flat cells, which provide lower power density output than that provided in accordance with the principles of the present teachings.

Laser power beaming uses a laser to deliver concentrated light to a remote receiver. The receiver then converts the light to electricity, much like solar powered photovoltaic (PV) cells convert sunlight into electricity.

Key differences between laser and solar illuminations are i) laser can be much more intense than the sun, ii) laser light can be directed to any place using adaptive optics, iii) laser can operate continuously and/or controlled pulses, and iv) photovoltaics can be optimized to operate with monochromatic laser emission.

Power beaming technologies receive energy from a transmitter. The transmitter power is supplied from an electrical outlet, generator, a light concentrator, and/or a power storage unit (e.g., batteries and fuel cells). The wavelength and the shape of the beam are defined by a set of optics. This light then propagates through air, the vacuum of space, and/or through fiber optic cable until it reaches the receiver. The receiver then converts the light back into electricity/heat/etc.

Wireless power delivery requires physical installations at only the transmitting and receiving points, therefore, lowering the cost while enhancing the reliability of the system. Consequently, laser power beaming has numerous advantages over solar power.

In some embodiments, the present teachings provide a device that is more efficient (energy per surface area), less expensive, compact, lightweight, portable, advanced (uses the state-of-the-art technologies to increase efficiency, lower the size and weight of machines by replacing traditional energy storage/delivery by wireless compact devices), etc. than traditional converters.

Previous proposed devices and methods have addressed the technologies/materials/fabrication processes and the cost analysis needed to achieve wireless energy delivery; however, electromagnetic energy converter and method of the present teachings aim to assemble together the existing, well-researched building blocks to enable a more affordable, more efficient and sustainable solution to the energy conversion/harvest problem.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Figure 1:
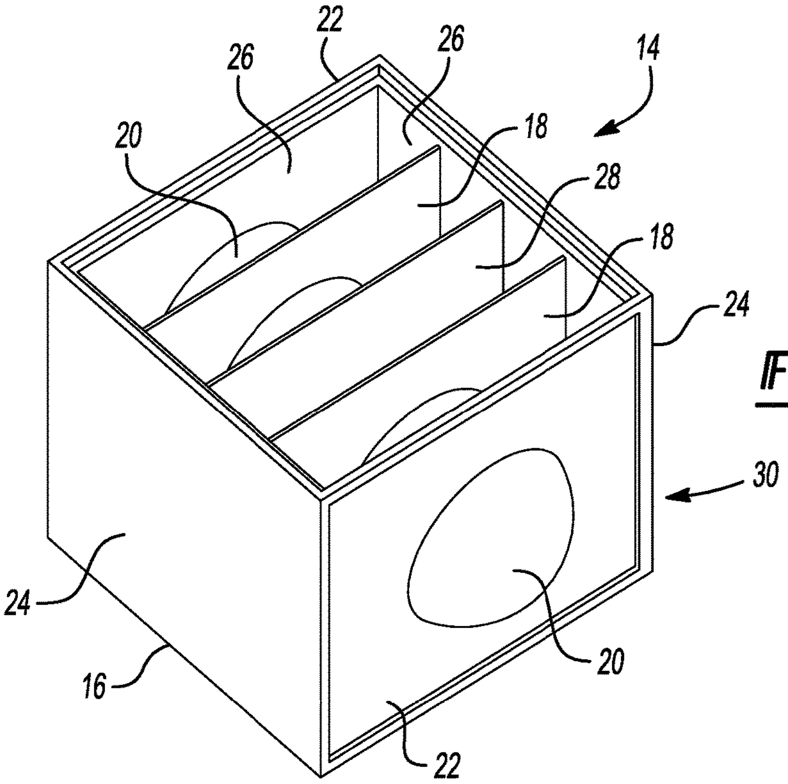
FIG. 1 illustrates a perspective view of an enclosed electromagnetic (EM) energy converter according to the principles of the present teachings.

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of electromagnetic energy converter 14 in use or operation in addition to the orientation depicted in the figures. For example, if electromagnetic energy converter 14 in the figures is turned over, elements described as "below" or "beneath" other elements or features would then be oriented "above" the other elements or features. Thus, the example term "below" can encompass both an orientation of above and below. Electromagnetic energy converter 14 may be otherwise oriented (rotated 90 degrees or at other orientations) and the spatially relative descriptors used herein interpreted accordingly.

Various projects have investigated in depth the applications of wireless energy conversion/harvest technology. The present teachings address the unmet need for converting wave/particle energy of varying intensities to power electronic/thermal/mechanical devices without the need for physical connections (e.g., wires).

With particular reference to FIGS. 1-18, in some embodiments, the present teachings provide an electromagnetic energy converter system 10 (see FIGS. 2 and 18) having an energy source 12 and an electromagnetic (EM) energy converter 14 to convert mono and/or polychromatic wave and/or particle energy from energy source 12 to electricity and/or heat in electromagnetic energy converter 14. In particular, the present teachings incorporate a third dimension to traditional energy conversion devices to increase conversion efficiency (i.e. watts per square meter).

In some embodiments, energy source 12 can comprise high-power lasers, particle accelerometers, or other synthetic electromagnetic energy sources radiating waves such as but not limited to radio waves, microwaves, infrared emission, visible emission, ultraviolet emission, X-rays, and Gamma rays to illuminate electromagnetic energy converter 14. In some embodiments, energy source 12 can be a naturally-occurring source, such as but not limited to the sun, luminescence, thermal radiation, plasma radiation, radioactive radiation, and vibration. Moreover, energy source 12, in some embodiments, is ground-based, air-based, and/or space-based. The electromagnetic energy used in the present teachings can be of various waveforms including but not limited to short pulses, sine waves, modified sine waves, square waves, and arbitrary waves. The electromagnetic energy used in the present teachings is also selected from a list of monochromatic, polychromatic, polar, non-polar, coherent, non-coherent, collimated, and divergent waveforms.

In some embodiments, electromagnetic energy converter 14 comprises an enclosure case or housing 16 having one or more cells 18 (e.g., a photovoltaic cell, a thermophotovoltaic cell, a thermionic converter, a thermoelectric converter, a piezoelectric converter, an electrochemical converter, or a bio-electrochemical converter) disposed at least partially within housing 16. In some embodiments, cells 18 can comprise, but not limited to, inorganic cells, organic cells, amorphous cells, polycrystalline cells, monocrystalline cells, organic light emitting diodes (OLEDs), quantum dots, perovskite cells, thermophotovoltaic cells and the like. In some embodiments, cells 18 are comprised of materials in gas, liquid, or solid phases or a combination thereof. In some embodiments, cells 18 are in the form of films, slabs, sheets, rods, particles, solution, mixture or the like. These substances are used to convert (monochromatic and polychromatic) EM energy to electricity. It should be understood that electromagnetic energy converter 14 can comprise a plurality of cells 18 being of different types or of similar types with different bandwidths or operational and physical characteristics.

In some embodiments, electromagnetic energy converter 14 can comprise one or more lenses or optical inputs 20 for receiving and manipulating mono and/or polychromatic wave and/or particle energy from energy source 12. In some embodiments, housing 16 can be substantially rectangular shaped having opposing end faces 22 and side faces 24. In some embodiments, one or both end faces 22 can include one or more lenses 20. It should be understood that lenses or optical inputs 20 are optional in some embodiments and thus wave and/or particles can be introduced in alternative ways, such as but not limited to through holes, or non-transforming mediums (such as non-optical material).

In some embodiments, electromagnetic energy converter 14 can comprise a plurality of internal layers or materials 26 disposed along one or more (e.g. all) internal surfaces of housing 16 to direct or manipulate the wave or particle energy within the housing 16 to enhance contact with cells 18. In other words, in some embodiments, electromagnetic energy converter 14 can comprise an internal layer 26 disposed on an interior facing surface of one or more of end faces 22 and side faces 24. In some embodiments, internal layer 26 is a diffusive and/or dispersive and/or luminescent medium. For example, in some embodiments, internal layer 26 can comprise a diffusive material/composite, such as but not limited to polymers including acrylic resin, polycarbonate, and polymethyl methacrylate. In some embodiments, internal layer 26 can comprise a dispersive medium, preferably a transparent matrix into which a dispersing material is placed. Each dispersing medium has distinct dispersive powers and is comprised of dispersive material such as but not limited to small light-scattering particles such as titanium dioxide crystals and metallic mirrors. In some embodiments, internal layer 26 can comprise a luminescent material, such as but not limited to inorganic luminescent materials such as quantum dots, light-emitting dopants and organic and fluorescent Dyes. Luminescent materials can be used to convert the incoming wave and/or particle from one type and/or wavelength to one compatible with electromagnetic energy converter 14 and, specifically, cells 18. It should be understood that internal layer 26 can include a combination of transparent, refractive, diffusive, dispersive, and luminescent characteristics. In some embodiments, internal layer 26 comprises one or more highly-reflective and/or non-absorbing materials to increase conversion efficiency of electromagnetic energy converter 14. It should be understood that electromagnetic energy converter 14 can comprise a plurality of layers or materials 26 being of different types or of similar types with different operational characteristics.

In some embodiments, electromagnetic energy converter 14 can comprise one or more active, adaptive, and/or optoelectronic optical systems, generally referenced as 30. Such systems can comprise lenses or waveguides 20 and/or additional one or more optical layers 28 disposed within or outside housing 16. In some embodiments, optical layer 28 can be disposed between adjacent cells 18 as illustrated in FIG. 1. Optical layer 28 can comprise diffusive and/or dispersive and/or luminescent medium material, such as but not limited to metallic mirrors. In some embodiments, optical system 30 is an active system that actively manages transmission and/or reflection of EM wave and/or particle into electromagnetic energy converter 14 and to cells 18. In some embodiments, optical system 30 is housed outside the convertor and is comprised of active and/or adaptive optics 46 to prevent deformation due to external influences such as wind, temperature, mechanical stress or to compensate for atmospheric effects.

Figure 2:
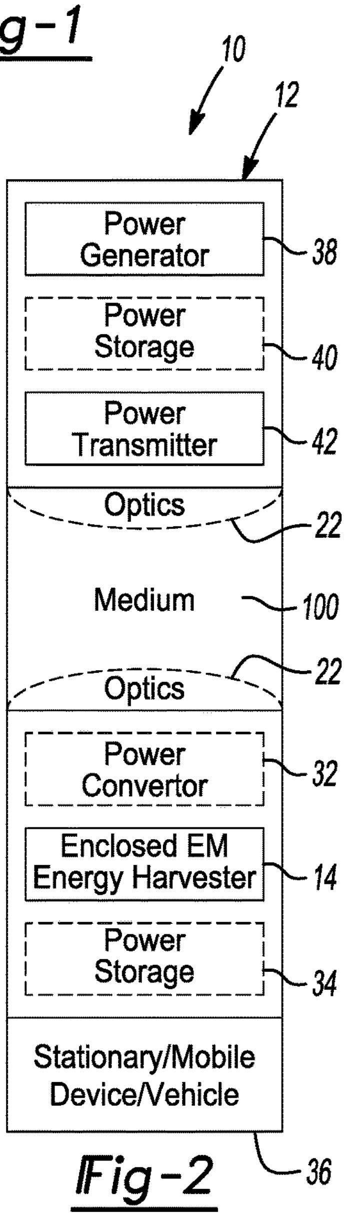
FIG. 2 is a schematic view illustrating the principles of operation of the present teachings.
Figure 16:
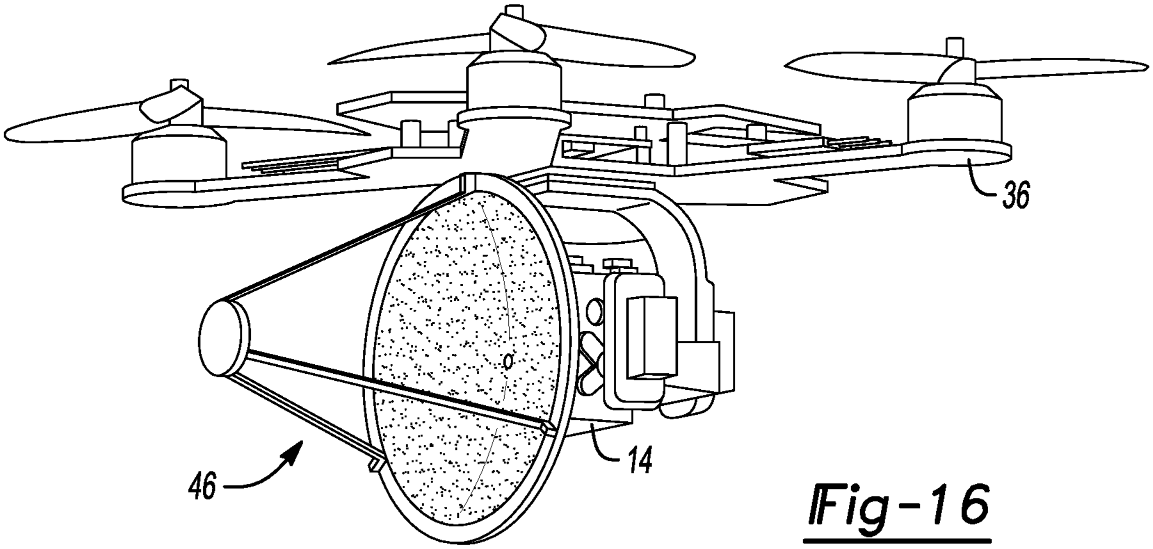
FIG. 16 illustrates a perspective view of an electromagnetic (EM) energy converter mounted to an unmanned aerial vehicle (UAV) according to the principles of the present teachings.
Figure 17:
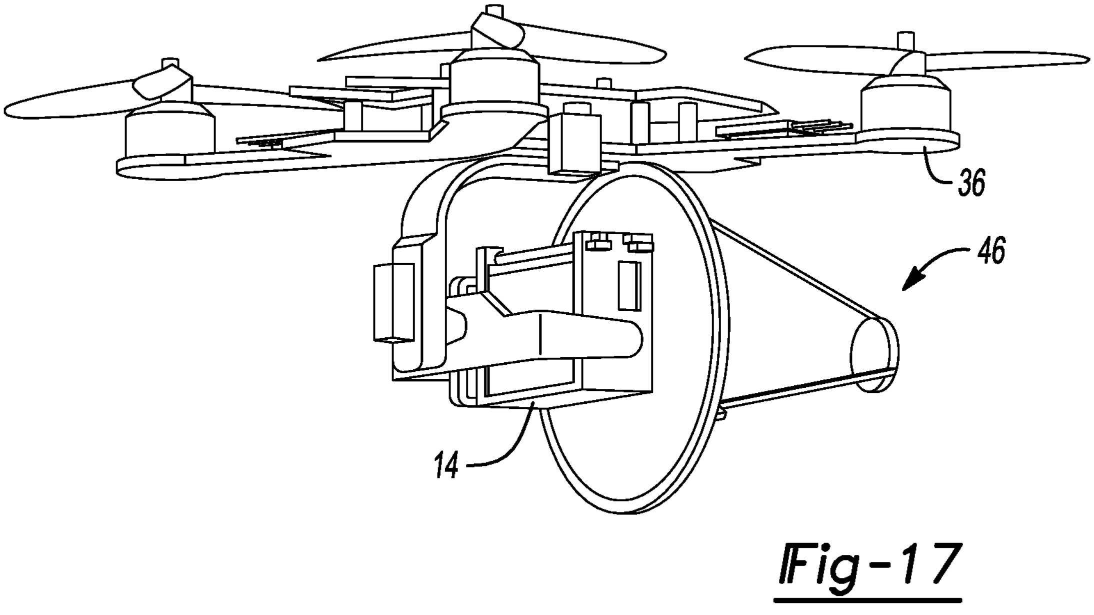
FIG. 17 illustrates a perspective view of an electromagnetic (EM) energy converter of FIG. 16 mounted to an unmanned aerial vehicle (UAV) according to the principles of the present teachings.
Figure 18:
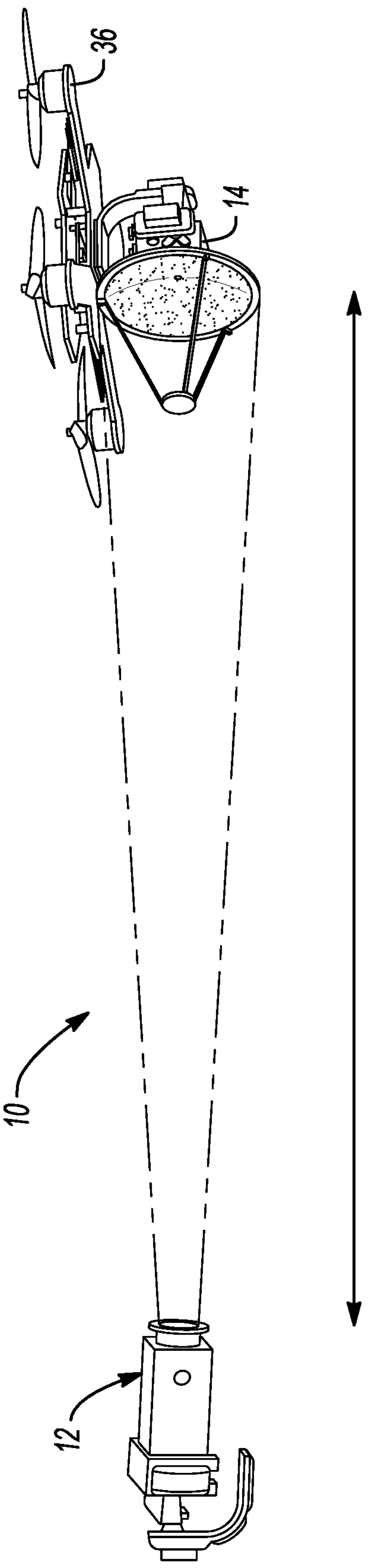
FIG. 18 illustrates a perspective view of an electromagnetic (EM) energy converter and the principles of operation of the present teachings.

With particular reference to the schematic of FIG. 2, electromagnetic energy converter system 10 is shown having energy source 12 and an electromagnetic (EM) energy converter 14 operably coupled across a medium 100. It should be understood that medium 100 can comprise any medium operable to transmit wave and/or particle energy, such as but not limited to air, gas, liquid, solid, vacuum, fiber optic, and the like. As illustrated in FIG. 2, electromagnetic energy converter system 10 can comprise an optional power converter 32 and a power storage system 34. In some embodiments, power converter 32 is configured to convert and/or filter wave and/or particle energy to another form, frequency, and/or type. In this way, power converter 32 can be used to specifically convert ultraviolet beam to, for example, visible beam or other useable form. In some embodiments, optical filters are used to alter the wave into a uniform waveform such as polar or collimated waveforms. In some embodiments, a diffraction medium (e.g., diffraction grating or prism) is used to selectively choose a narrow bandwidth. In some embodiments, shutters control EM radiation intervals for improved safety and also to enable short-duration pulses of EM radiation. Additionally, it should be understood that power storage 34 can be operably coupled to electromagnetic energy converter 14 to store and/or otherwise manage the use of the produced electricity output from electromagnetic energy converter 14. In some embodiments, electromagnetic energy converter 14 and optional power converter 32 and/or power storage 34 can be carried or otherwise supported by a stationary member (i.e. physical support or foundation) and/or a mobile device (e.g. unmanned aerial vehicle (UAV), aircraft, boat, vessel, vehicle, train, satellite, or any structure requiring or benefit from energy usage, or storage, and/or retransmission), collectively referenced at 36. It should be noted that particular application in a UAV is illustrated in FIGS. 16-18.

With continued reference to FIG. 2, likewise, energy source 12 can comprise a power generator 38, an optional power storage system 40, and a power transmitter 42. In some embodiments, energy source 12 comprises, but is not limited to, a diffuse laser 12.

Figure 3:
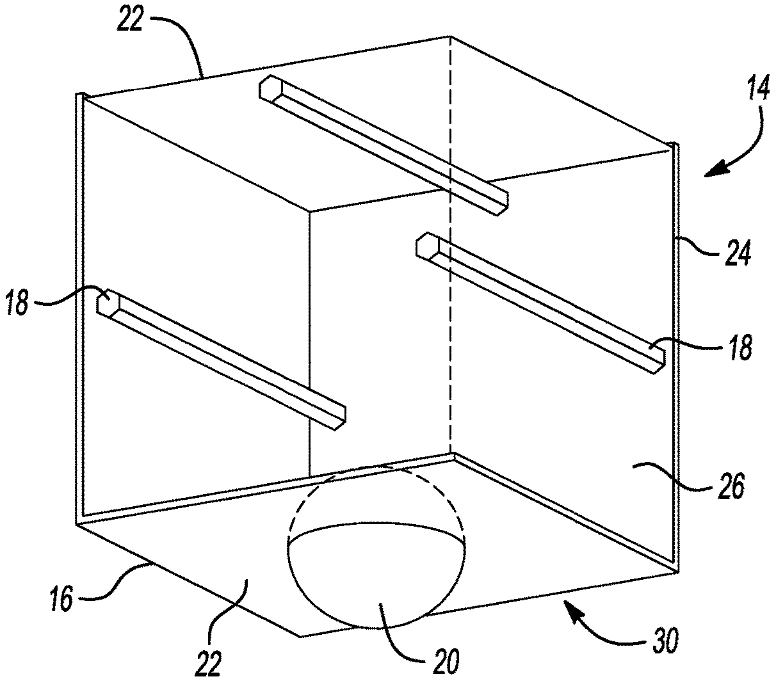
FIG. 3 illustrates a perspective view of an open-face electromagnetic (EM) energy converter according to the principles of the present teachings having a liquid or solid converter.

With reference to FIG. 3, in some embodiments, electromagnetic energy converter system 10 can comprise a gas, liquid or solid electromagnetic energy converter 14 disposed through a part or an entirety of the internal volume of housing 16. In this regard, gas, liquid or solid electromagnetic energy converter 14 generally fills a remaining volume within housing 16 unoccupied by associated structure. In some embodiments, as illustrated in FIG. 3, cells 18 can comprise rod-shaped elements to conduct the EM energy converted into electric current, such as but not limited to reflective rod elements.

Figure 4:
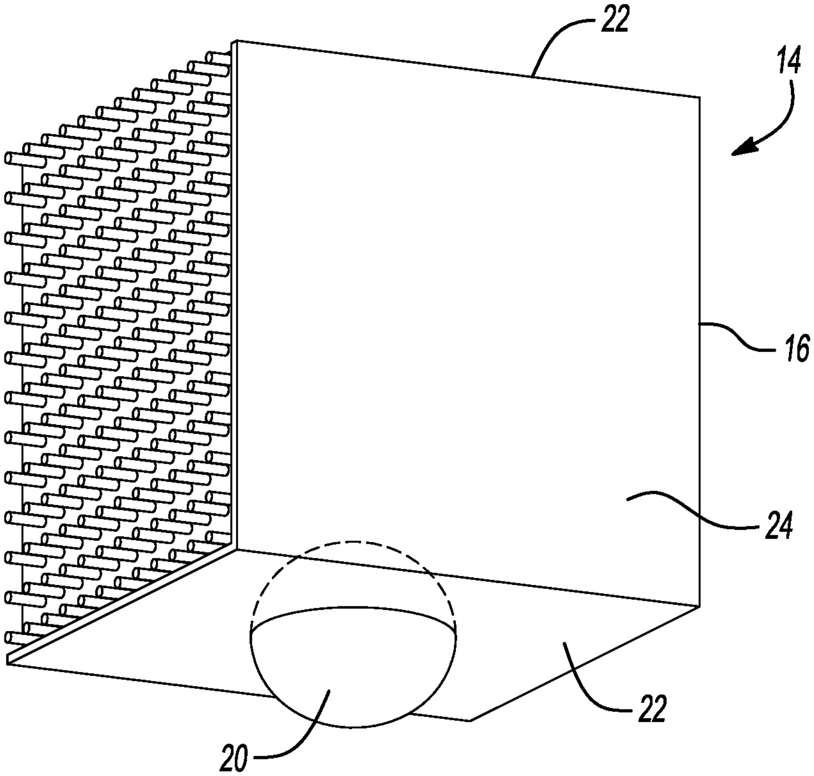
FIG. 4 illustrates a perspective view of an electromagnetic (EM) energy converter according to the principles of the present teachings having a matrix of electric poles that conducts converted EM energy.
Figure 5:
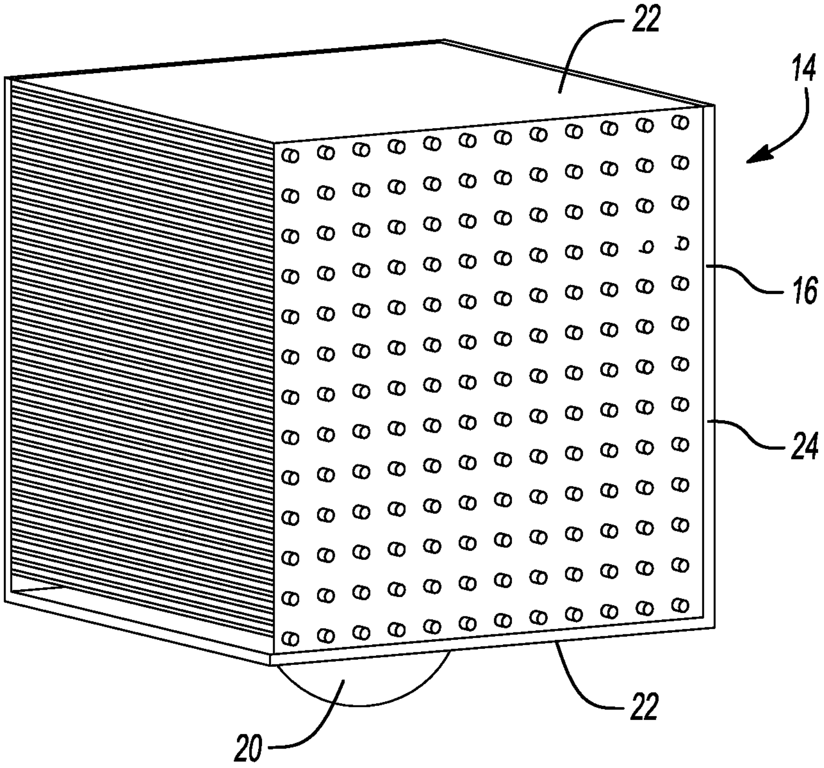
FIG. 5 illustrates a perspective view of the electromagnetic (EM) energy converter of FIG. 4.

In some embodiments, as illustrated in FIGS. 4 and 5, electromagnetic energy converter 14 can comprise a matrix of electric poles that conducts the converted EM energy. An electric circuit, such as schematically illustrated in FIG. 2, can comprise diodes, capacitors, and other electric components to regulate, store, and/or consume the EM energy converted into electric current.

Figure 6:
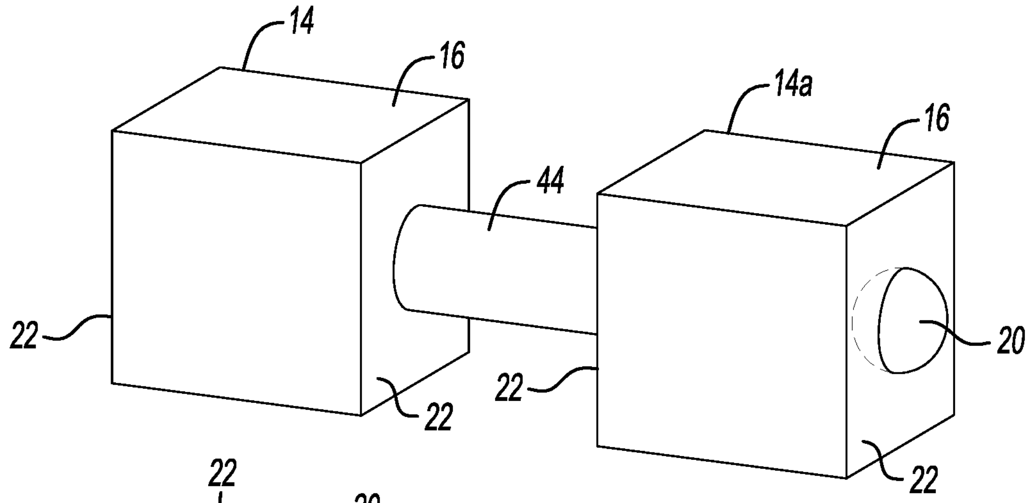
FIG. 6 illustrates a perspective view of a pair of electromagnetic (EM) energy converters coupled in series according to the principles of the present teachings.
Figure 7A:
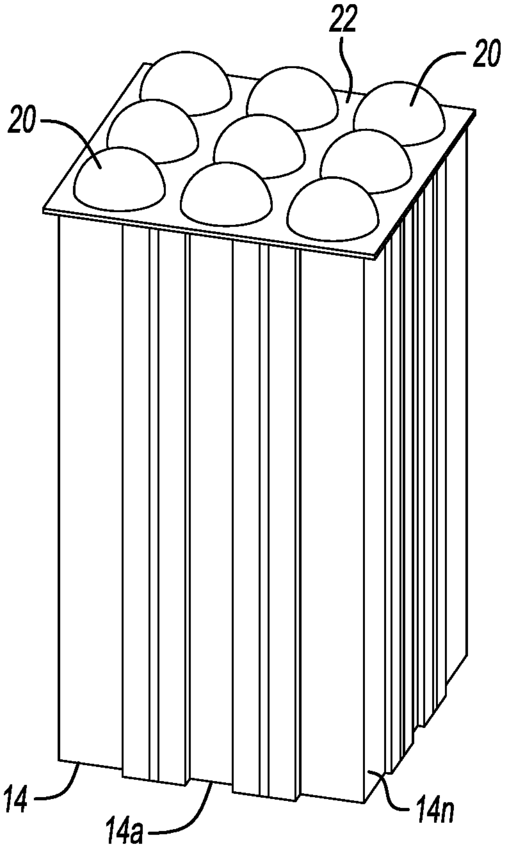
FIG. 7A illustrates a perspective view of a plurality of electromagnetic (EM) energy converter coupled in parallel according to the principles of the present teachings.

With particular reference to FIGS. 6 and 7A, in some embodiments, electromagnetic energy converter system 10 can comprise a plurality of electromagnetic energy converters 14, 14*a*, . . . 14*n* to enhance the degree to which the EM beam is converted to electricity. In such embodiments, electromagnetic energy converters 14, 14*a* may be coupled in in series (FIG. 6) and/or in parallel (FIG. 7A). With reference to FIG. 6, electromagnetic energy converters 14, 14*a* can be operably and physically coupled via an optical interface or waveguide 44 to permit and facilitate the transmission and communication of waves and/or particles between electromagnetic energy converters 14, 14*a*. In some embodiments, optical interface 44 can be part of optical system 30 and can comprise, but is not limited to, a fiber optic cable. It should be understood that waves and/or particles can travel uni-directionally or multi-directionally between electromagnetic energy converters 14, 14*a*. With reference to FIG. 7A, in some embodiments, electromagnetic energy converters 14, 14*n* can be arranged such that each of electromagnetic energy converters 14, 14*a*, 14*n* is parallel to an adjacent electromagnetic energy converter and each may include an individual lens 20 or a common lens. Moreover, in some embodiments, each electromagnetic energy converter 14, 14*a*, 14*n* can remain self-contained, thereby preventing sharing of wave and/or particle input energy, or may permit transmission of wave and/or particle input energy to adjacent converts.

Figure 7B:
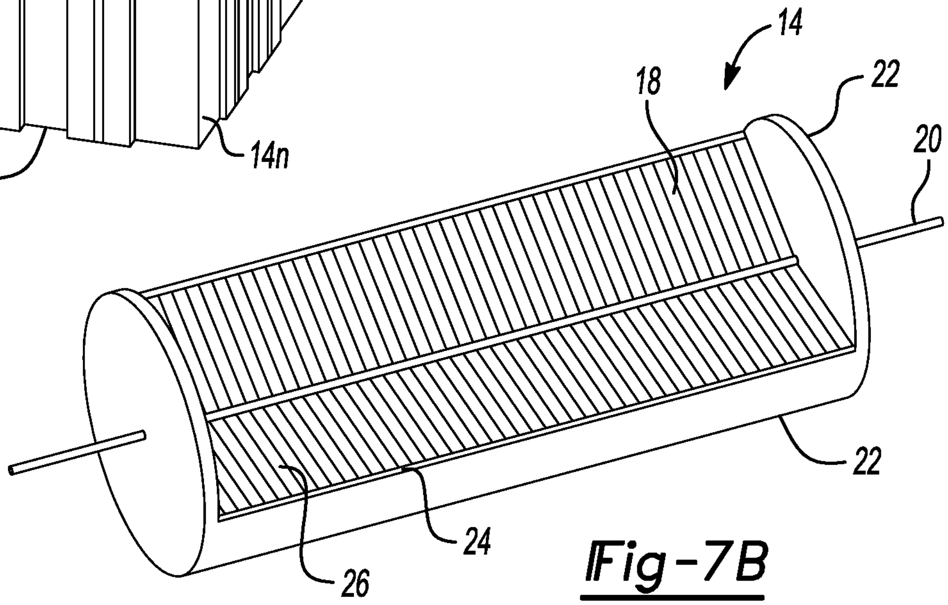
FIG. 7B illustrates a perspective view of an electromagnetic (EM) energy converter mounted around a fiber optic transmitting EM energy and information.

With reference to FIG. 7B, in some embodiments, electromagnetic energy converter 14 can comprise a combination of cells 18, different concentrations (radial gradient) of EM energy-dispersive material within a light-transmissive medium 26 enclosed within a housing 22, conductive film, reflective surfaces to reflect the EM energy back into the EM energy-dispersive material within a light-transmissive medium. The EM energy transmits into EM energy convertor through a fiber optic 20. The fiber optic can be stripped of its cladding over a distal length. A fraction of the EM energy enters the EM energy converter while scattering and propagating in the radially-gradient EM energy-dispersive medium. The EM energy is reflected off the reflective end faces 22 and side faces 24 back into the dispersive medium. In some embodiments, multiple refractive layers with different refraction indexes are used to selectively guide EM-waves. In general, with the combination of the above elements the directionality and intensity distribution of the EM wave entering the EM convertor may be controlled. The remaining fraction of EM energy propagates through the fiber optic out of the EM convertor on the other end. The outgoing fraction of EM wave may be used to communicate information.

Figure 8:
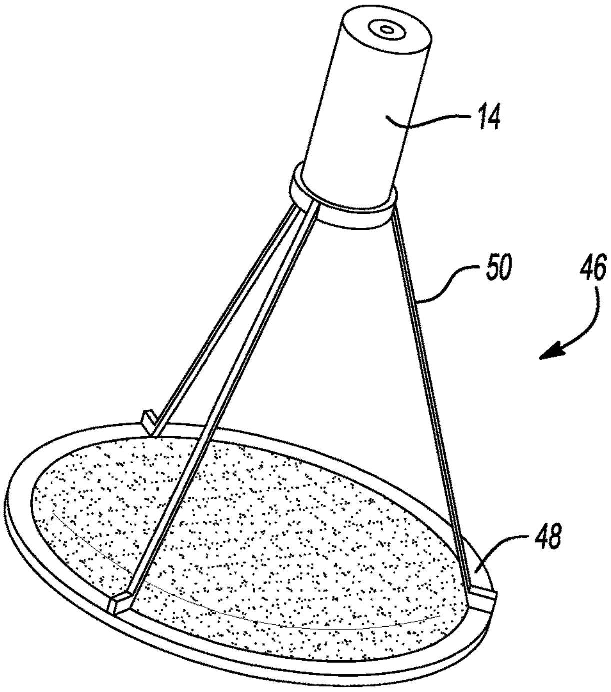
FIG. 8 illustrates a perspective view of an electromagnetic (EM) energy converter mounted to an EM receiver dish according to the principles of the present teachings.
Figure 9:
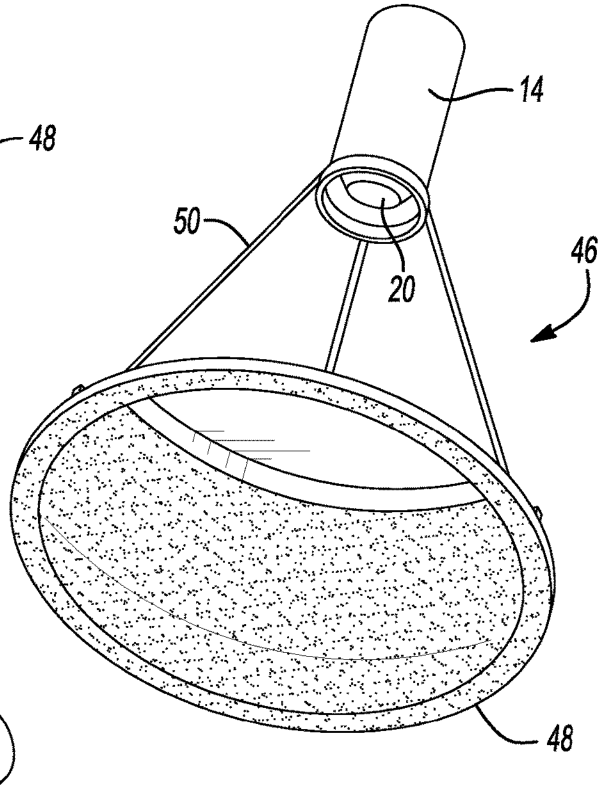
FIG. 9 illustrates a second perspective view of the electromagnetic (EM) energy converter of FIG. 8 mounted to the EM receiver dish according to the principles of the present teachings.
Figure 10:
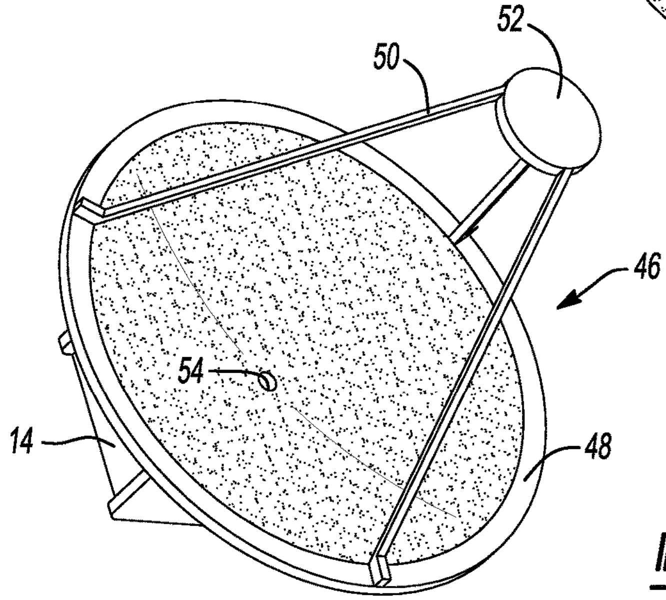
FIG. 10 illustrates a perspective view of an electromagnetic (EM) energy converter mounted to an EM receiver dish according to the principles of the present teachings.
Figure 11:
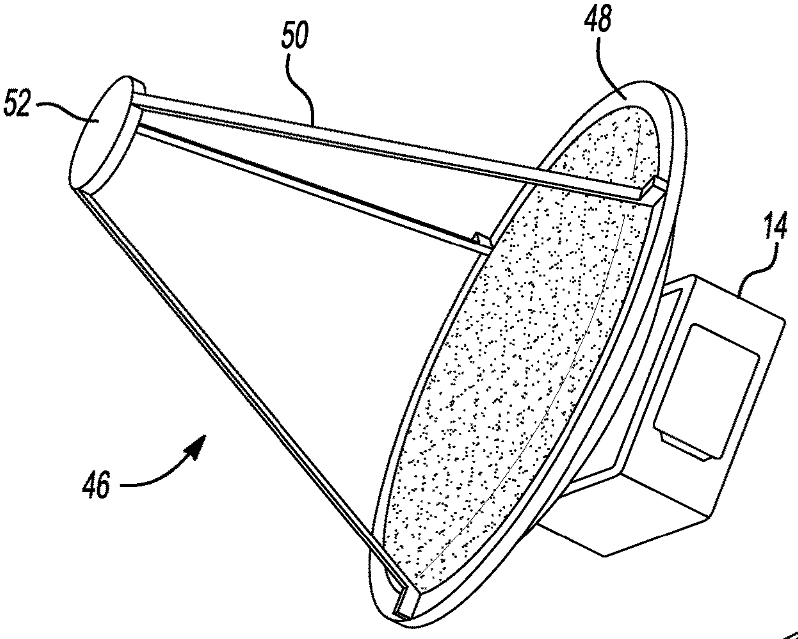
FIG. 11 illustrates a second perspective view of the electromagnetic (EM) energy converter of FIG. 10 mounted to the EM receiver dish according to the principles of the present teachings.

With reference to FIGS. 8 and 9, in some embodiments, electromagnetic energy converter 14 can be mounted on or supported by an EM receiver dish 46. EM receiver dish 46 can comprise a dish member 48 for receiving energy transmitted from energy source 12 or other source (i.e. naturally occurring source). In some embodiments, dish member 48 is a parabolic dish supporting electromagnetic energy converter 14 via legs 50 configured to focus the received energy directly to an input (e.g. lens 20) of electromagnetic energy converter 14. In some embodiments, to minimize loss of energy, a single-bounce configuration of EM receiver dish 46 can be used (i.e. energy received is bounced a single time before focused into electromagnetic energy converter 14). Similarly, with reference to FIGS. 10 and 11, in some embodiments, EM receiver dish 48 can comprise electromagnetic energy converter 14 mounted behind dish member 48 and a supplemental active and/or adaptive optics 30 such as a concentrator dish 52 supported by legs 50 is used to focus the energy transmitted to electromagnetic energy converter 14 to a through hole 54 formed in dish member 48 coupled to lens 20 of electromagnetic energy converter 14. In this way, energy can be focused, albeit via two bounces, to electromagnetic energy converter 14. As seen in FIGS. 16-18, in some embodiments, electromagnetic energy converter 14 (singly or with EM receiver dish 48) may be mounted, supported, and carried by vehicles, such as UAVs and the like. In some embodiments, electromagnetic energy converter system 10 can comprise an accurate and precise tracking and feedback system 62 for high-precision and reliable energy delivery. In some embodiments, adaptive optics 30 can be employed to compensate for potential environmental turbulences.

Figure 12:
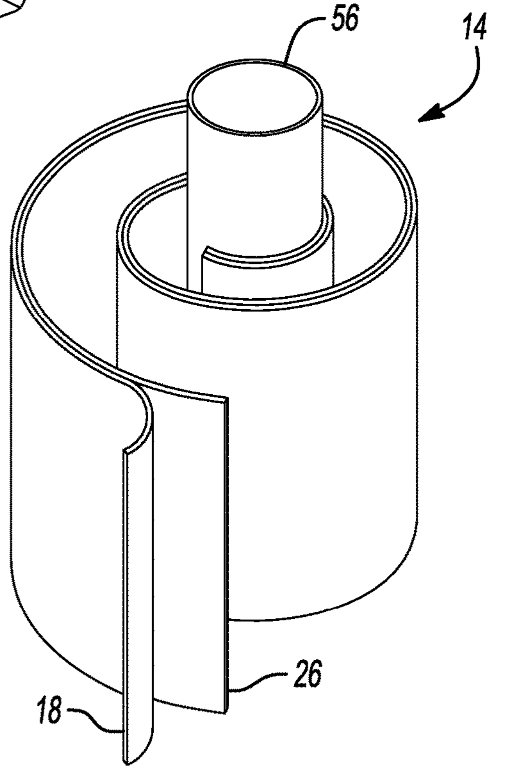
FIG. 12 illustrates a perspective view of an electromagnetic (EM) energy converter having a roll-able construction according to the principles of the present teachings.
Figure 13:
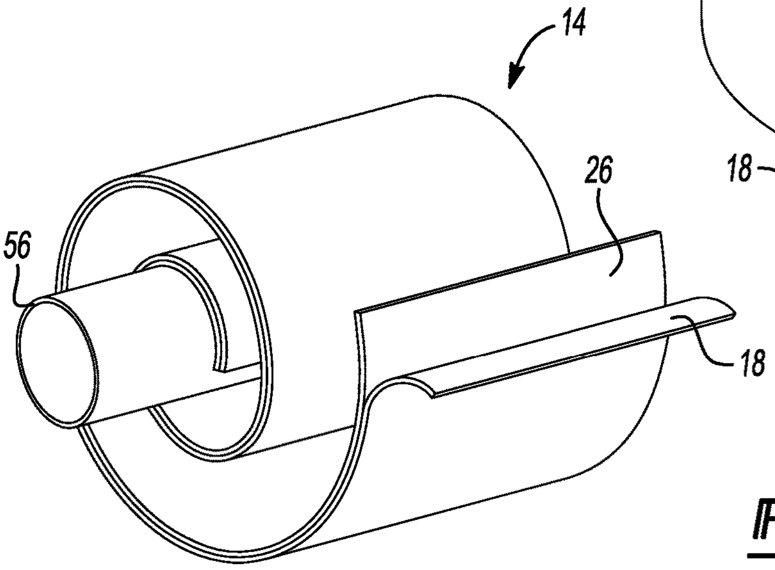
FIG. 13 illustrates a perspective view of the electromagnetic (EM) energy converter of FIG. 12 having a roll-able construction according to the principles of the present teachings.

With reference to FIGS. 12 and 13, in some embodiments, electromagnetic energy converter 14 can comprise a ribbon architecture comprising a centrally disposed fiber optic 56 having a ribbon of cells 18' and conductive material (e.g., film), together with a reflective or diffusive layer 26. In other words, in some embodiments, electromagnetic energy converter 14 can comprise roll-able sheets including a photovoltaic material, dispersive medium, reflective medium, conductive (and, in some embodiments, dielectric) material, and wave guides (i.e., refractive medium). The EM energy propagates through the wave guide and can be stripped of its cladding over a distal length. The EM energy is introduced into the converter while scattering and propagating in a dispersive medium. The EM beam is reflected off the reflective surfaces.

Figure 14:
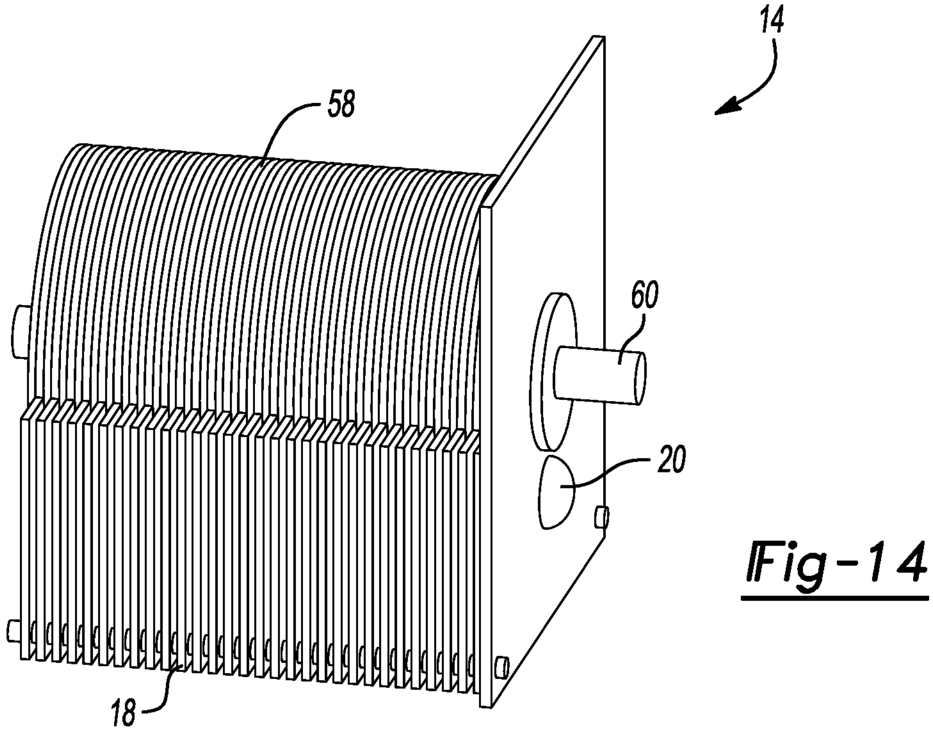
FIG. 14 illustrates a perspective view of an adjustable electromagnetic (EM) energy converter according to the principles of the present teachings.
Figure 15:
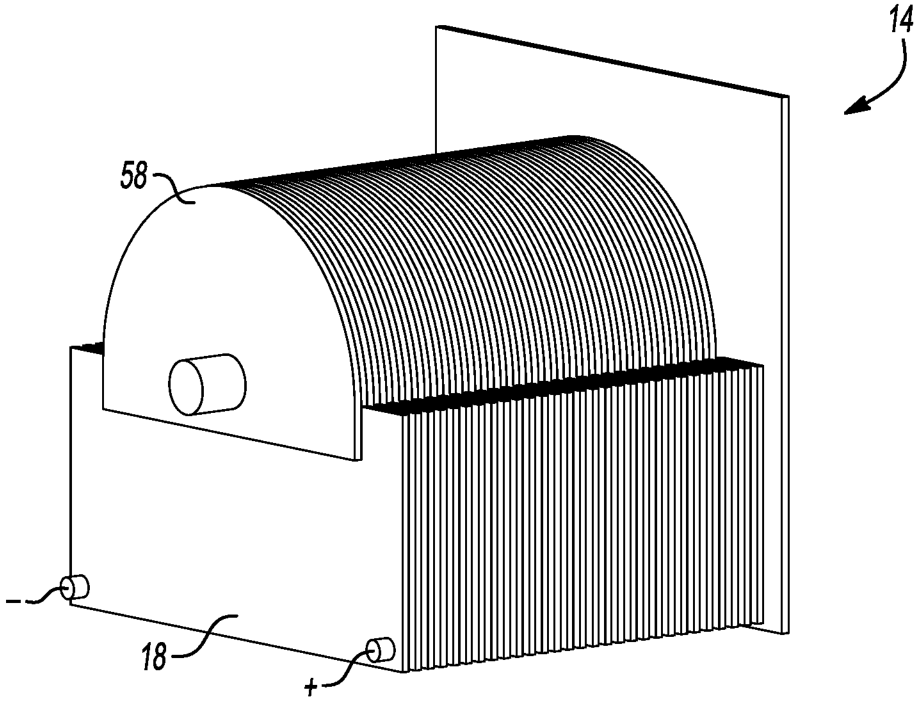
FIG. 15 illustrates a perspective view of the adjustable electromagnetic (EM) energy converter of FIG. 14 according to the principles of the present teachings.

In some embodiments, as illustrated in FIGS. 14 and 15, a generally adjustable electromagnetic energy converter 14'. The output of adjustable electromagnetic energy converter 14' is a function of the relative positions of an array of disks 58 interspersed within cells 18 (disposed in parallel). The output of electromagnetic energy converter 14' is changed via rotation of disks 58 to obstruct or otherwise reveal cells 18 to incoming EM wave and/or particles. The relative position of the array of disks is changed by rotating a pin member 60 operably coupled to disks 58 that selective, partially, and/or completely obstructs or otherwise reveals cells 18 to EM wave and/or particles entering lens 20. In some embodiments, the array of disks 58 is coated with refractive and/or reflective materials.

According to the principles of the present teachings, electromagnetic energy converter system 10 and/or electromagnetic energy converter 14 has been disclosed that is particularly suited for use in any one or a number of applications, including, but not limited to, the efficient delivery and/or storage of transmitted power. In fact, electromagnetic energy converter system 10 and/or electromagnetic energy converter 14 can be used, for example, to power microelectromechanical devices (MEMS), electronic circuits and devices, transportation elements (e.g. buses, trains, cars, aircraft, and the like), space and long distance applications (e.g. satellites in orbit or aircraft in general (airplanes, UAVs, etc.)). The principles of the present teachings replace bulky and fragile solar panels with a reliable, resilient, compact, light-weight device that is mobile and efficient.

What is claimed is:

1. An electromagnetic energy converter system for converting electromagnetic energy to electricity, the electromagnetic energy converter system comprising:

a first electromagnetic energy converter having a plurality of non-coplanar electromagnetic energy converting cells disposed within a housing, an electromagnetic energy-receiving face of each of the plurality of non-coplanar electromagnetic energy converting cells extending away from an axis along which electromagnetic energy is received in the housing; and an internal layer disposed within the housing and filling a space between major planar surfaces of the electromagnetic energy converting cells, the internal layer comprising a transparent matrix and configured as a dispersive medium to direct electromagnetic energy toward each of the plurality of electromagnetic energy converting cells.

2. The electromagnetic energy converter system according to claim 1, further comprising a second electromagnetic energy converter being operably coupled to the first electromagnetic energy converter via an optical waveguide.

3. The electromagnetic energy converter system according to claim 1, wherein the first electromagnetic energy converter further comprises at least one active optics, adaptive optics, or optical wave guides.

4. The electromagnetic energy converter system according to claim 1, wherein the first electromagnetic energy converter further comprises a heat dissipation system.

5. The electromagnetic energy converter system according to claim 1, wherein the first electromagnetic energy converter further comprises a power converter system configured to convert or filter wave or particle energy.

6. The electromagnetic energy converter system according to claim 1, wherein the first electromagnetic energy converter further comprises an electronic device attached to or disposed at least partially within the internal layer, the electronic device configured to use or manipulate electricity.

7. The electromagnetic energy converter system according to claim 1, wherein the first electromagnetic energy converter further comprises a substrate supporting the plurality of electromagnetic energy converting cells.

8. The electromagnetic energy converter system according to claim 1, wherein the first electromagnetic energy converter is transportable.

9. The electromagnetic energy converter system according to claim 1, wherein internal surfaces of the housing are at least partially coated with one or more layers of reflective material.

10. The electromagnetic energy converter system according to claim 1, wherein the internal layer comprises composite materials.

11. The electromagnetic energy converter system according to claim 1, wherein the internal layer comprises a plurality of materials of different chemical and physical properties to modify the electromagnetic energy.

12. The electromagnetic energy converter system according to claim 1, further comprising a domed lens.

13. The electromagnetic energy converter system according to claim 1, further comprising an EM receiver.

14. The electromagnetic energy converter system according to claim 1, wherein the internal layer comprises a solid material.

15. The electromagnetic energy converter system according to claim 1, wherein the internal layer comprises a liquid or gel material.

16. The electromagnetic energy converter system according to claim 1, wherein the plurality of electromagnetic energy converting cells comprises electromagnetic energy converting cells of different types.

17. The electromagnetic energy converter system according to claim 1, wherein the plurality of electromagnetic energy converting cells are coated with at least one layer of conductive, luminescent, transmissive, absorptive, diffusive, refractive, dispersive materials, or a combination thereof.

18. The electromagnetic energy converter system according to claim 1, wherein the plurality of electromagnetic energy converting cells comprises an array of poles.

19. The electromagnetic energy converter system according to claim 1, wherein the internal layer is configured to receive electromagnetic energy in a first direction and redirect at least some of the received electromagnetic energy in a different second direction toward at least one of the electromagnetic energy converting cells.

20. The electromagnetic energy converter system according to claim 1, further comprising at least one optical input located along the axis and through which electromagnetic energy is received in the housing, the housing having an internal volume defined by end faces and one or more side faces of the housing, wherein the internal layer fills a remaining volume within the housing, the remaining volume being defined as the internal volume of the housing exclusive of the electromagnetic energy converting cells and any portion of the optical input within the internal volume.

21. The electromagnetic energy converter system according to claim 1, wherein the internal layer comprises an electromagnetic energy dispersive material within the transparent matrix.

22. The electromagnetic energy converter system according to claim 1, wherein a plane defined by each light-receiving face of each electromagnetic energy converting cell intersects the axis.

23. The electromagnetic energy converter system according to claim 1, wherein each light-receiving face of each electromagnetic energy converting cell extends radially away from the axis.

24. An electromagnetic energy converter system for converting electromagnetic energy to electricity, the electromagnetic energy converter system comprising:

a housing;

a plurality of non-coplanar electromagnetic energy converting cells and an EM energy-dispersive medium enclosed within the housing, the EM electromagnetic energy converting cells being arranged in the housing along an axis, and an electromagnetic energy-receiving face of each cell of the plurality of cells extending away from the axis, wherein the system is configured to receive electromagnetic energy in the housing along the axis and scatter and propagate at least a portion of the received electromagnetic energy in the electromagnetic energy dispersive medium to reach the plurality of electromagnetic energy converting cells.

25. The electromagnetic energy converter system according to claim 24, wherein a plane defined by each light-receiving face of each electromagnetic energy converting cell intersects the axis.

26. The electromagnetic energy converter system according to claim 24, wherein each light-receiving face of each electromagnetic energy converting cell extends radially away from the axis.

27. The electromagnetic energy converter system according to claim 24, wherein the internal layer comprises a ribbon architecture.

* * * * *